United States Patent
Kaempf

(10) Patent No.: US 10,232,471 B2
(45) Date of Patent: *Mar. 19, 2019

(54) METHOD FOR DIVIDING A COMPOSITE INTO SEMICONDUCTOR CHIPS, AND SEMICONDUCTOR CHIP

(71) Applicant: OSRAM Opto Semiconductors GmbH, Regensburg (DE)

(72) Inventor: Mathias Kaempf, Burglengenfeld (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/845,883

(22) Filed: Dec. 18, 2017

(65) Prior Publication Data

US 2018/0117706 A1    May 3, 2018

Related U.S. Application Data

(63) Continuation of application No. 14/911,024, filed as application No. PCT/EP2014/066398 on Jul. 30, 2014, now Pat. No. 9,873,166.

(30) Foreign Application Priority Data

Aug. 8, 2013   (DE) .................. 10 2013 108 583

(51) Int. Cl.
*H01L 23/544*     (2006.01)
*B23K 26/53*      (2014.01)
(Continued)

(52) U.S. Cl.
CPC .............. *B23K 26/53* (2015.10); *B23K 26/38* (2013.01); *B23K 26/40* (2013.01); *H01L 21/268* (2013.01);
(Continued)

(58) Field of Classification Search
CPC .... H01L 21/268; H01L 21/6835; H01L 21/78
See application file for complete search history.

(56) References Cited

U.S. PATENT DOCUMENTS 5,912,477 A    6/1999 Negley
6,849,524 B2   2/2005 Shelton et al.
(Continued)

FOREIGN PATENT DOCUMENTS

CN    1441971 A    9/2003
CN    1515025 A    7/2004
(Continued)

*Primary Examiner* — Stephen Bradley
*Assistant Examiner* — Wasiul Haider
(74) *Attorney, Agent, or Firm* — McDermott Will & Emery LLP

(57) ABSTRACT

The invention relates to a method for dividing a composite into a plurality of semiconductor chips along a dividing pattern. A composite, which comprises a substrate, a semiconductor layer sequence, and a functional layer, is provided. Separating trenches are formed in the substrate along the dividing pattern. The functional layer is cut through along the dividing pattern by means of coherent radiation. Each divided semiconductor chip has part of the semiconductor layer sequence, part of the substrate, and part of the functional layer. The invention further relates to a semiconductor chip.

12 Claims, 4 Drawing Sheets

(51) Int. Cl.
  *B23K 26/38* (2014.01)
  *B23K 26/40* (2014.01)
  *H01L 21/268* (2006.01)
  *H01L 21/683* (2006.01)
  *H01L 21/78* (2006.01)
  *H01L 33/00* (2010.01)
  *B23K 101/40* (2006.01)
  *B23K 103/00* (2006.01)

(52) U.S. Cl.
  CPC .......... *H01L 21/6835* (2013.01); *H01L 21/78* (2013.01); *H01L 33/0095* (2013.01); *B23K 2101/40* (2018.08); *B23K 2103/56* (2018.08); *H01L 2221/68327* (2013.01)

(56) References Cited

U.S. PATENT DOCUMENTS

| | | | |
|---|---|---|---|
| 8,080,445 B1* | 12/2011 | Pagaila | H01L 23/49827 257/E21.499 |
| 2002/0127824 A1 | 9/2002 | Shelton et al. | |
| 2006/0199374 A1* | 9/2006 | Feng | H01L 23/3107 438/635 |
| 2006/0205182 A1* | 9/2006 | Soejima | H01L 21/78 438/460 |
| 2006/0228825 A1 | 10/2006 | Hembree | |
| 2007/0194420 A1 | 8/2007 | Feng | |
| 2009/0267100 A1* | 10/2009 | Miyake | B82Y 20/00 257/98 |
| 2010/0120230 A1* | 5/2010 | Grivna | H01L 21/78 438/464 |
| 2010/0135347 A1* | 6/2010 | Deladurantaye | H01S 3/06754 372/30 |
| 2010/0317132 A1* | 12/2010 | Rogers | H01L 25/0753 438/27 |
| 2011/0070456 A1* | 3/2011 | Philippens | H01L 51/0097 428/523 |
| 2011/0143467 A1* | 6/2011 | Xiong | H01L 21/0237 438/29 |
| 2013/0249095 A1* | 9/2013 | Shen | H01L 23/481 257/751 |
| 2014/0038392 A1* | 2/2014 | Yonehara | H01L 21/304 438/463 |
| 2014/0183761 A1* | 7/2014 | Lin | H01L 24/11 257/787 |

FOREIGN PATENT DOCUMENTS

| | | |
|---|---|---|
| CN | 102388472 A | 3/2012 |
| DE | 102011015725 A1 | 10/2012 |
| JP | 2008042143 A | 2/2008 |

* cited by examiner

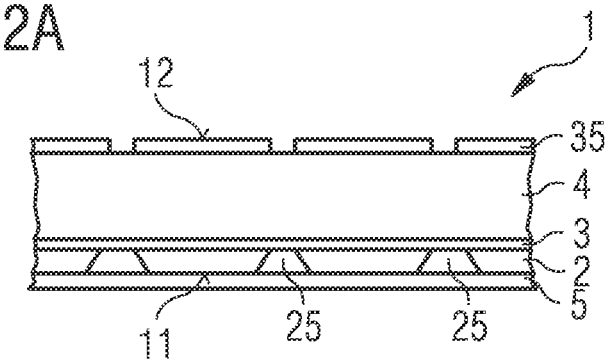
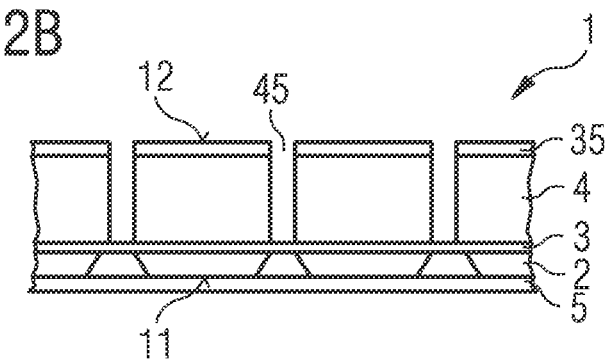
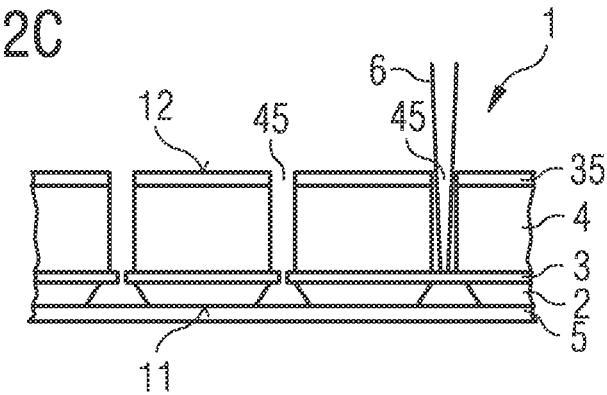
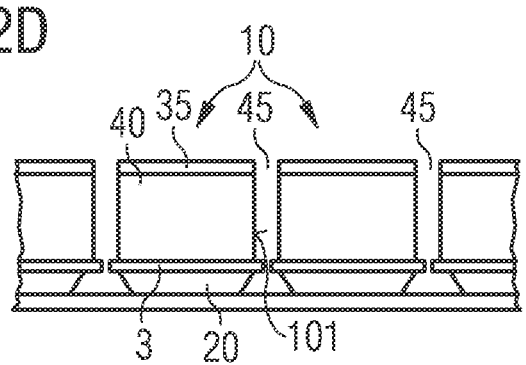

METHOD FOR DIVIDING A COMPOSITE INTO SEMICONDUCTOR CHIPS, AND SEMICONDUCTOR CHIP

CROSS-REFERENCE TO RELATED APPLICATIONS

This application is a continuation application of U.S. patent application Ser. No. 14/911,024, filed on Feb. 8, 2016, which is the national stage of International Patent Application No. PCT/EP2014/066398, filed on Jul. 30, 2014, which claims the benefit of priority under 35 U.S.C. § 119 of German Patent Application No. 102013108583.0 filed on Aug. 8, 2013, all of which are hereby incorporated by reference in their entirety for all purposes.

DESCRIPTION

The present application relates to a method for dividing a composite into a plurality of semiconductor chips, and a semiconductor chip of this type.

Different methods can be used to divide semiconductor wafers into semiconductor chips, these methods in particular cutting through the substrate material. However, the efficiency of most dividing methods is strongly dependent on the material to be cut through.

It is an object to provide a simple and reliable dividing method. Furthermore, a semiconductor chip should be provided which can be produced more simply.

These objects are achieved inter alia by a method or semiconductor chip according to the independent claims. Embodiments and developments are described in the dependent claims.

A method for dividing a composite into a plurality of semiconductor chips is provided.

According to at least one embodiment of the method a composite is provided. The composite extends in a vertical direction between a first major surface and a second major surface. The division takes place in particular along a dividing pattern. For example, the dividing pattern can be formed in a grid-like manner. However, the division does not necessarily have to take place along straight lines. It is rather the case that the division can also produce semiconductor chips with side surfaces produced during division which are curved at least in regions or have at least one kink.

According to at least one embodiment of the method, the composite has a carrier. The carrier contains, e.g. a semiconductor material such as silicon, germanium, gallium phosphide or gallium arsenide or consists of such a material. The carrier can be electrically conductive or electrically isolating.

According to at least one embodiment of the method, the composite has a semiconductor layer sequence. The semiconductor layer sequence is e.g. deposited epitaxially, such as by means of MOCVD or MBE. The semiconductor layer sequence can be deposited on the carrier or on a growth substrate different from the carrier. For example, the semiconductor layer sequence contains an active region provided to produce radiation and/or to receive radiation.

For example, the semiconductor layer sequence, in particular the active region, contains a III-V compound semiconductor material. III-V compound semiconductor materials are particularly suitable for generating radiation in the ultraviolet spectral range ($Al_x In_y Ga_{1-x-y} N$) through the visible spectral range ($Al_x In_y Ga_{1-x-y} N$, in particular for blue to green radiation, or $Al_x In_y Ga_{1-x-y} P$, in particular for yellow to red radiation) to the infrared spectral range ($Al_x In_y Ga_{1-x-y} As$). In each case, $0 \leq x \leq 1$, $0 \leq y \leq 1$ and $x+y \leq 1$, in particular where $x \neq 1$, $y \neq 1$, $x \neq 0$ and/or $y \neq 0$. Furthermore, when generating radiation, high internal quantum efficiencies can be achieved using III-V compound semiconductor materials, in particular using said material systems.

The first major surface is located in particular on the side of the semiconductor layer sequence facing away from the carrier. Accordingly, the second major surface is located in particular on the side of the carrier facing away from the semiconductor layer sequence.

According to at least one embodiment of the method, the composite has a functional layer. The functional layer can be formed as a single layer or with multiple layers. The functional layer can comprise a metallic layer and/or a dielectric layer. For example, the functional layer or a partial layer thereof is connected in an electrically conductive manner to the semiconductor layer sequence. The functional layer can further be formed as a reflective layer for the radiation to be produced or to be detected in the semiconductor layer sequence. For example, the reflectivity for this radiation amounts to at least 60%.

According to at least one embodiment of the method, separating trenches are formed in the carrier, in particular along the dividing pattern. In the divided semiconductor chips, the side surfaces of the separating trenches form in particular the side surfaces defining the semiconductor chip in the lateral direction.

The lateral direction is understood to be a direction along a main extension plane of the semiconductor layers of the semiconductor layer sequence.

According to one embodiment variation, mesa trenches are already formed during formation of the separating trenches in the semiconductor layer sequence. The mesa trenches define the individual semiconductor bodies which arise from the semiconductor layer sequence. For example, the mesa trenches extend completely through the semiconductor layer sequence. In other words, the semiconductor layer sequence is already cut through during formation of the separating trenches. As seen in plan view, the dividing pattern extends onto the composite, i.e. along the mesa trenches. Accordingly, the formation of the separating trenches takes place along the mesa trenches.

According to an alternative embodiment variation, during formation of the separating trenches in the carrier, the semiconductor layer sequence is also at least partially cut through. The individual semiconductor bodies and carrier bodies of the semiconductor chips which are divided later are thus defined in a common production step.

According to at least one embodiment of the method, the functional layer is cut through by means of coherent radiation, in particular along the dividing pattern. The cutting through of the functional layer can take place before or after the formation of the separating trenches. A suitable radiation source is e.g. a laser in pulsed operation, in particular with a pulse duration of at most 100 ps, preferably at most 10 ps. Such short laser pulses are characterized by particularly low material selectivity. The material removal therefore takes place largely independently of the material of the functional layer or individual partial layers of the functional layer.

The divided semiconductor chips each have in particular a part of the semiconductor layer sequence, of the carrier and of the functional layer.

In at least one embodiment of the method, a composite is provided which has a carrier, a semiconductor layer sequence and a functional layer and which is provided for division along a dividing pattern. Separating trenches are formed in the carrier along the dividing pattern. The functional layer is cut through by means of coherent radiation along the dividing pattern. The semiconductor chips divided from the composite each have a part of the semiconductor layer sequence, of the carrier and of the functional layer.

By means of the material removal using coherent radiation, at the side surfaces of the semiconductor chips, which surfaces are produced during division, traces of a material removal by coherent radiation are produced in regions.

By means of the described method, the carrier can be cut through simply and efficiently, in particular by means of a chemical method. In contrast, a functional layer which is also disposed in particular in the region of the dividing pattern on the carrier and which has not been removed or has been removed only very slowly with a chemical method, is removed before or after the formation of the separating trenches by means of coherent radiation. Material removal such as this displays only slight material selectivity compared with etching methods. In a functional layer which contains a solder, the efficiency of the method is e.g. largely independent of the precise composition of the solder and of the phase distribution in the layer. In addition, changes in the material composition or production-induced fluctuations in the layer thickness of the functional layer have only comparatively slight effects on this method step.

With the described dividing method, in particular the high removal rate for semiconductor material in a chemical method such as a plasma separating method can be combined with the broad applicability of a radiation-induced material removal for different materials of a functional layer.

In the case of larger changes to the structure of the functional layer to be cut through with respect to the layer thickness and/or the material and/or the width of the trench to be formed in the functional layer, an adaptation of the process for the material removal by means of coherent radiation can take place more simply than with other, e.g. chemical, methods.

In addition, the methods can easily be automated with available factory systems (cassette to cassette).

According to at least one embodiment of the method, the functional layer comprises a metallic layer and/or a dielectric layer and the carrier contains a semiconductor material. The described multi-step division is particularly suitable for such a structure of the composite.

According to at least one embodiment of the method, the functional layer is disposed between the semiconductor layer sequence and the carrier. For example, the functional layer contains a connecting layer, such as a solder layer, with which the semiconductor layer sequence is fastened to the carrier. In a departure therefrom, the functional layer can, however, also be disposed on the side of the carrier facing away from the semiconductor layer sequence or on the side of the semiconductor layer sequence facing away from the carrier.

According to at least one embodiment of the method, the functional layer extends over the whole surface of the composite before cutting through by means of coherent radiation takes place. The functional layer can thus be fully unstructured in the lateral direction. In particular, after formation of the separating trenches in the carrier, neighboring semiconductor chips are each mechanically connected to one another via the functional layer.

According to at least one embodiment of the method, the separating trenches extend completely through the carrier. For example, the composite is still held together only by the functional layer after formation of the separating trenches.

According to at least one embodiment of the method, the separating trenches are formed by means of a chemical method. In particular, the trenches are formed by means of a plasma separating method, e.g. by means of an ICP (inductively coupled plasma) method or by means of deep reactive ion etching (DRIE). This method is also designated as the "Bosch process". Plasma separating methods can be characterized by high etching rates in particular in semiconductor material.

According to at least one embodiment of the method, the cutting through of the functional layer takes place after formation of the separating trenches. In this case, the coherent radiation can be radiated onto the functional layer through the separating trenches in order to cut through the functional layer. The formation of the separating trenches and the cutting through process can thus take place from the same side of the composite. In a departure therefrom, however, it is also feasible for the formation of the separating trenches and the cutting through of the functional layer to be carried out from opposite sides of the composite.

According to at least one embodiment of the method, the cutting through of the functional layer takes place before formation of the separating trenches. For example, the functional layer disposed between the semiconductor layer sequence and the carrier is first cut through by means of coherent radiation and then the carrier is cut through by means of a plasma separating method. The already cut-through functional layer can serve as a mask for the formation of the separating trenches. The separating trenches are produced in particular in a self-adjusting manner in the regions in which the functional layer is removed. In the lateral direction, the functional layer and the carrier bodies produced during division can be flush. In a departure therefrom, however, an additional mask or mask layer can also be provided.

According to at least one embodiment of the method, the composite has a further functional layer. In particular the functional layer and the further functional layer are spaced apart from one another in the vertical direction. For example, the functional layer and the further functional layer are disposed on opposite sides of the carrier. The further functional layer can in particular be formed as described in conjunction with the functional layer and can be cut through by means of coherent radiation.

Prior to division both the functional layer and also the further functional layer can thus be completely unstructured in the lateral direction and in particular completely cover the carrier along the dividing pattern. During division, the functional layer and the further functional layer can be cut through by means of coherent radiation along the dividing pattern, wherein the formation of the separating trenches is carried out between cutting through the functional layer and cutting through the further functional layer. During cutting through the further functional layer no further material removal of the already cut-through functional layer takes place. In contrast to this, a chemical removal of the further functional layer would also attack the functional layer and e.g. intensify the lateral undercutting. Thus, the application of a protective layer for protection of the functional layer during cutting through of the further functional layer may be dispensed with.

According to at least one embodiment of the method, the composite is attached to an auxiliary carrier before division, in particular before the formation of the separating trenches and/or before the cutting through of the functional layer. A suitable auxiliary layer can be e.g. a film, a rigid carrier or a plate in which the semiconductor chips still located in the composite or already divided are drawn by means of negative pressure or are fixed by means of electrostatic forces.

After division, the semiconductor chips can be present on the auxiliary carrier in a geometric arrangement, e.g. in a matrix-like structure. The further processing of the semiconductor chips is thereby simplified.

According to at least one embodiment of the method, during cutting through, the functional layer is cut through along the dividing pattern only in places, i.e. in the lateral direction and not over the entire composite, so that at least one region of the composite has a plurality of contiguous semiconductor chips after division. Thus a segment or a plurality of segments can be formed from the composite, each with a plurality of semiconductor chips.

According to at least one embodiment, a semiconductor chip has a semiconductor body, a carrier body and a functional layer which are disposed one on another in a vertical direction. On at least one side surface of the semiconductor chip, the functional layer has traces of material removal by coherent radiation. In order to produce such a semiconductor chip a structuring of the functional layer before cutting through by means of coherent radiation may be dispensed with.

According to at least one embodiment of the semiconductor chip, the functional layer is disposed between the carrier body and the semiconductor body. The functional layer or a partial layer thereof can be formed e.g. as a connecting layer for an integrally bonded connection between the semiconductor body and the carrier body. In the case of an integrally bonded connection the preferably pre-produced elements of the connection are held together by means of atomic and/or molecular forces. An integrally bonded connection can be achieved e.g. by a connecting means such as an adhesive agent or a solder. Generally, a separation of the connection is associated with destruction of the connection means and/or at least one of the elements of the connection. For example, the semiconductor chip is formed as a thin-film semiconductor chip in which a growth substrate for the semiconductor layer sequence of the semiconductor body is removed and the carrier body mechanically stabilizes the semiconductor body.

According to at least one embodiment of the semiconductor chip, the semiconductor chip has a further functional layer which is disposed on a side of the carrier body facing away from the semiconductor body. In particular, on at least one side surface of the semiconductor chip, the further functional layer has traces of material removal by coherent radiation. The further functional layer can be formed e.g. as a carrier-side electrical contact for the external electric contacting of the semiconductor chip.

The method described above for dividing a composite into semiconductor chips is particularly suitable for the production of the semiconductor chip. Therefore, features described in conjunction with the method can also be applied to the semiconductor chip, and vice-versa.

Further features, embodiments and developments will be apparent from the following description of the exemplary embodiments in conjunction with the figures.

In the figures:

FIGS. 2A to 2D illustrate a second exemplary embodiment of a method for dividing a composite with the aid of intermediate steps illustrated in each case in a schematic cross-sectional view, and of a semiconductor chip in FIG. 2E;

FIGS. 4A and 4B illustrate photographs of a partial region of a divided composite, wherein FIG. 4B shows an enlarged section of FIG. 4A.

Figure 1A:
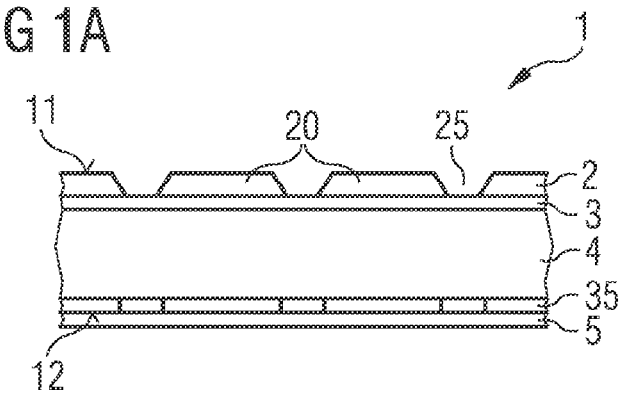
FIGS. 1A to 1D illustrate a first exemplary embodiment of a method for dividing a composite with the aid of intermediate steps illustrated in each case in a schematic cross-sectional view, and of a semiconductor chip in FIG. 1D.

Identical, similar components or components which act in an identical manner are provided with the same reference numerals in the figures. The figures and the size ratios of the elements with respect to each other, as illustrated in the figures, are not to be considered as being to scale. Rather, individual elements and in particular layer thicknesses, can be illustrated excessively large for improved clarity and/or for improved understanding.

A first exemplary embodiment of a dividing method is illustrated with the aid of FIGS. 1A to 1D in each case in a schematic cross-sectional view. As shown in FIG. 1A, a composite 1 is provided which is intended for division into a plurality of semiconductor chips. For example, the semiconductor chips are optoelectronic semiconductor chips, having an active region (not explicitly shown in the figures for the sake of simpler illustration) provided to produce and/or to receive radiation. In the exemplary embodiment illustrated in FIG. 1A, the composite 1 comprises a semiconductor layer sequence 2 which is divided into a plurality of semiconductor bodies 20 by means of mesa trenches 25. The semiconductor layer sequence has e.g. a thickness between 1 μm and 20 μm inclusive. The semiconductor layer sequence 2, in particular the active region, contains e.g. one of the compound semiconductor materials mentioned in the general part of the description. The semiconductor layer sequence 2 is disposed on a carrier 4. The carrier contains e.g. a semiconductor material such as silicon or germanium. Another semiconductor material such as gallium phosphide or gallium arsenide can also be used.

A functional layer 3 is disposed between the semiconductor layer sequence 2 and the carrier 4. The functional layer 3 contains e.g. a connection layer by which the semiconductor layer sequence 2 is attached to the carrier 4 in an integrally bonded manner, this may be a solder layer or an electrically conductive adhesive layer. The functional layer 3 can further comprise a partial layer which is provided as a metallic reflective layer for the radiation to be produced or to be absorbed in the semiconductor bodies 20. For example, the reflective layer contains silver. Alternatively or additionally, the functional layer 3 can also comprise a dielectric layer.

The composite is formed for the production of thin-film semiconductor chips, in particular thin-film light-emitting diode chips. A growth substrate for the epitaxial deposition of the semiconductor layer sequence 2 has already been removed in the stage shown in FIG. 1A. The carrier 4 mechanically stabilizes the semiconductor layer sequence.

A further functional layer 35 is formed on the side of the carrier 4 facing away from the semiconductor layer sequence 2. In the illustrated exemplary embodiment, the further functional layer in the divided semiconductor chips serves for electrical contacting of the semiconductor chips.

The composite 1 extends in a vertical direction between a first major surface 11 and a second major surface 12. The first major surface 11 is formed by the semiconductor layer sequence 2. However, in a departure from this, one or a plurality of layers can be disposed on the semiconductor layer sequence 2, e.g. a passivation layer and/or a layer for electrical contacting or current spreading.

The composite 1 is attached to an auxiliary carrier 5 by means of the second major surface 12. The auxiliary carrier can be e.g. a film stretched on a frame. Alternatively, the auxiliary carrier 5 can also be a rigid carrier or an apparatus, in which the composite 1 and in particular the subsequently divided semiconductor chips 10 are fixed by means of negative pressure or by means of electrostatic forces. By means of the auxiliary carrier, the divided semiconductor chips can be present in a geometric arrangement, e.g. in the form of a matrix. In this way, further processing is simplified.

Figure 1B:
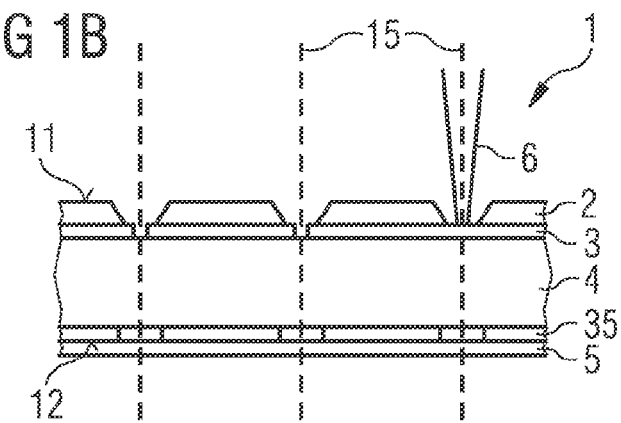

As illustrated in FIG. 1B, the composite 1 is irradiated from the first major surface along a dividing pattern 15 with coherent radiation 6, e.g. laser radiation with pulse durations in the nanosecond or picosecond range. The radiation preferably has a pulse duration of at most 100 ps, preferably at most 10 ps. It has proved to be the case that such short laser pulses are characterized by particularly low material selectivity.

Furthermore, it has proved to be the case that the production of mutually successive sub-pulses, which are separated from one another in time, within the actual pulse duration by means of so-called "burst" technology effects efficient division. These sub-pulses can be produced by a so-called "pulse picker". By means of pre-pulses (bursts) conditioning of the material to be divided can take place so that the following pulses impact the material in a different energy state. This can effect a qualitatively high and additionally efficient material removal. By means of pulse durations in the nanosecond range and the burst technology the material removal can be of a similar level of efficiency to the use of pulse durations in the picosecond range without burst technology. Furthermore, the burst technology can also be used in conjunction with pulse durations in the picosecond range.

The dividing pattern 15 can have e.g. a grid structure with first dividing lines in a first direction and with second dividing lines which extend inclined or perpendicular with respect to the first dividing lines. The dividing patterns can also extend in a curved manner at least in regions or can be formed such that the divided semiconductor chips as seen in plan view have a basic shape with more than four corners, e.g. a hexagonal basic shape.

In this exemplary embodiment, the dividing pattern 15 extends along the mesa trenches 25. In a departure from this, it is also feasible that the semiconductor layer sequence 2 and the functional layer 3 are cut through by means of coherent radiation in a common production step.

By reason of the low material selectivity of the removal by means of coherent radiation, in particular with lasers in pulsed operation in the picosecond range, the cutting through of the functional layer 3 takes place largely independently of the material composition of the functional layer or of the partial layers thereof. Fluctuations in the material composition occurring over the composite 1, e.g. fluctuations in the alloy or solder constituents or in the phase distribution in the connecting layer, also do not lead to undesired inhomogeneous material removal of the functional layer 3 in the lateral direction. The material removal can be controlled by adjusting the parameters of the laser, in particular the wavelength, the pulse duration, the frequency and the pulse form and by the further method parameters such as in particular the beam caustics, the beam geometry, the feed rate and the optical power.

When cutting through composites 1 which differ comparatively strongly in the composition of the functional layer 3, a simple adaptation of this laser ablation process without heavy development costs can be rapidly adapted to the changed conditions.

In a departure from the described exemplary embodiment, the composite can also be attached to the auxiliary carrier 5 only after the functional layer has already been cut through. Furthermore, it is also feasible that the individual steps take place on different auxiliary carriers. For this purpose, one or a plurality of adhesion or re-adhesion steps can be carried out. An auxiliary carrier formed as a film can be expanded as necessary between two steps.

Figure 1C:
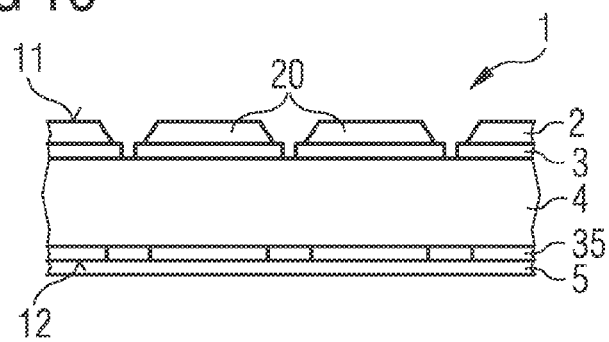
Figure 1D:
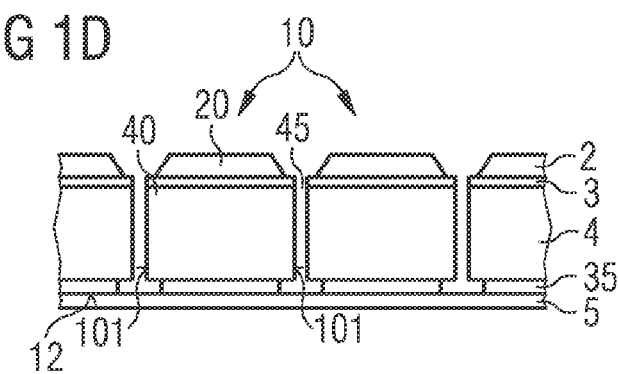

The composite 1 with the cut-through functional layer 3 is shown in FIG. 1C. Separating trenches 45 are then formed in the carrier along the dividing pattern 15. The semiconductor chips 10 thus divided, which each have a semiconductor body 20 and a carrier body 40 protruding out of the carrier 4, are shown in FIG. 1D.

The separating trenches are preferably formed by means of a chemical method, in particular by means of a dry-chemical method such as a plasma separating method. For example, an ICP (inductively coupled plasma) separating method or deep reactive ion etching can be used. With such a method, in particular semiconductor materials such as silicon and germanium can be removed with high removal rates. The separating trenches 45 thus produced extend in the vertical direction completely through the carrier 4 so that the semiconductor chips 10 are only still connected to one another via the auxiliary carrier 5.

In this exemplary embodiment the functional layer 3 is thus first removed by means of coherent radiation before the separating trenches 45 are formed from the same side of the composite. The functional layer 35 can serve as a mask for the formation of the separating trenches 45. Thus, a mask during formation of the separating trenches may be dispensed with. In a departure from this, however, it is also feasible for a mask or mask layer to be provided on the further functional layer 3.

The described separating method brings together the low material selectivity and the high removal rates, which can be achieved thereby, for dielectric material and metallic material of a laser ablation method with the high removal rates of a chemical separating method, in particular a plasma method, for semiconductor materials. It has proved to be the case that such a two-step method is characterized as a whole by a particularly high level of reliability and by high through-put rates.

In particular, the method has particularly low sensitivity with respect to process fluctuations in the preceding steps for production of the composite, e.g. in view of fluctuations in the layer thickness of the functional layer 3. In addition, the method can be automated more simply, e.g. by a cassette-to-cassette process.

The described method is largely independent of the specific embodiment of the semiconductor chips to be divided from a composite. For example, the semiconductor chips can also comprise two front or two rear contacts. Furthermore, one or a plurality of further layers can be disposed on the semiconductor layer sequence 2 or the semiconductor body 20, e.g. a passivation layer, such as an oxide layer or a nitride layer, and/or a layer containing a TCO (transparent conductive oxide) material and/or a layer containing a luminescent material provided for radiation conversion.

In the described method, the functional layer 3 can also be cut through only in places along the dividing pattern so that at least one region of the composite 1 has a plurality of connected semiconductor chips after the formation of the separating trenches and the cutting through of the functional layer.

The second exemplary embodiment illustrated in FIGS. 2A to 2D differs from the first exemplary embodiment described in conjunction with FIGS. 1A to 1D in particular in that the composite 1 is attached to the auxiliary carrier 5 by means of the first major surface 11. The semiconductor layer sequence 2 is thus disposed between the carrier 4 and the auxiliary carrier 5. As shown in FIG. 2B, separating trenches 45 are formed in the carrier 4 from the second major surface 12. After formation of the separating trenches 45, the composite 1 still remains connected together via the functional layer 3. As shown in FIG. 2C, this functional layer 3 is cut through by the coherent radiation 6 through the separating trenches. In this exemplary embodiment the formation of the separating trenches thus takes place before the functional layer is cut through. The formation of the separating trenches 45 and the cutting through of the functional layer 3 can take place as described in conjunction with FIGS. 1A to 1D.

As illustrated in FIG. 2D, the functional layer 3 can extend in the lateral direction over a side surface 101 of the divided carrier bodies 40. The functional layer thus protrudes over the carrier body at least in regions, in particular along the whole periphery of the semiconductor chip.

Figure 3A:
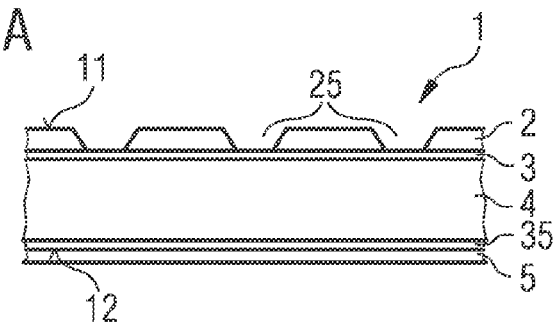
FIGS. 3A to 3E illustrate a third exemplary embodiment of a method for dividing a composite with the aid of intermediate steps illustrated in each case in a schematic cross-sectional view, and of a semiconductor chip in FIG. 3E.
Figure 3B:
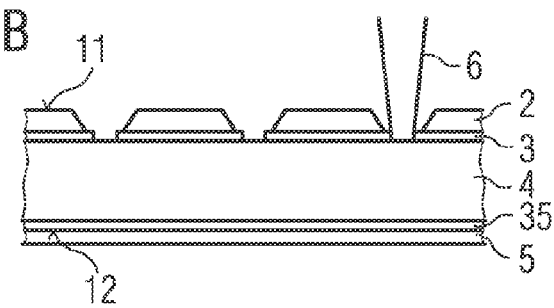
Figure 3C:
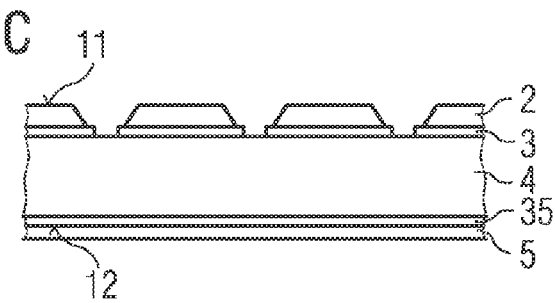
Figure 3D:
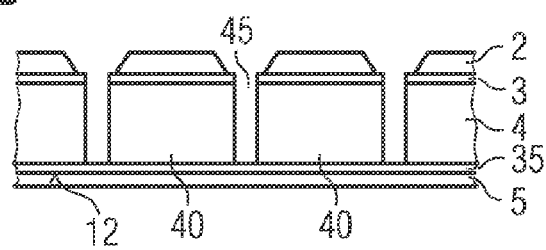

The third exemplary embodiment illustrated in FIGS. 3A to 3E corresponds substantially to the first exemplary embodiment described in conjunction with FIGS. 1A to 1D. In contrast to this, the further functional layer 35 of the composite 1 is first formed as a through-going layer (FIG. 3A). As shown in FIGS. 3B to 3D, the functional layer 3 is subsequently cut through by means of coherent radiation 6 and separating trenches 45 are formed in the carrier 4 for formation of individual carrier bodies 40. These steps can be carried out as described in conjunction with FIGS. 1A to 1D.

Figure 3E:
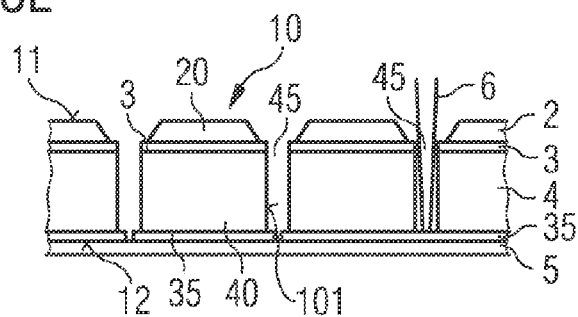

Finally, the further functional layer 35 is likewise cut through by means of coherent radiation 6 so that the divided semiconductor chips 10 are still only mechanically connected to one another via the auxiliary carrier 5 (FIG. 3E). In contrast to a chemical removal method, the removal of the further functional layer 35 does not effect any additional material removal of the functional layer 3 already previously cut through, even if these layers have the same or at least a comparable material composition. In contrast to this, a chemical material removal of the further functional layer 35 would also effect a further material removal of the functional layer 3 already previously cut through.

If the composite 1 thus comprises a plurality of layers which are similar in their material composition, the application of auxiliary layers to protect side surfaces from upstream layers already cut through may be dispensed with.

Figure 4A:
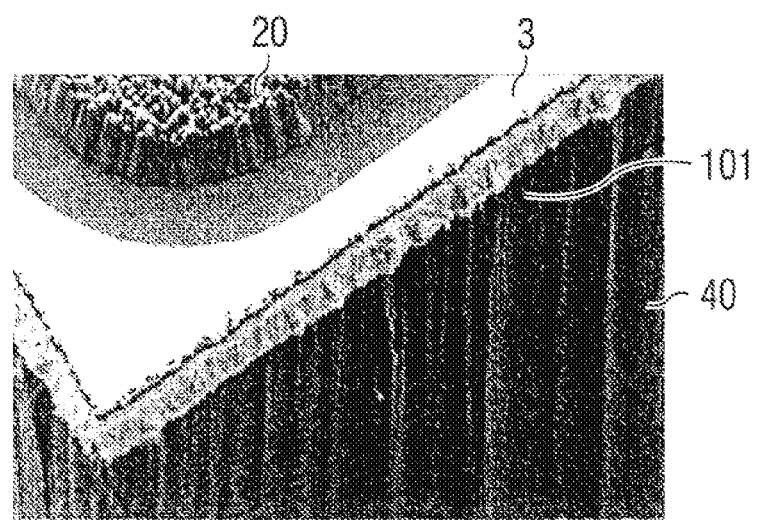
Figure 4B:
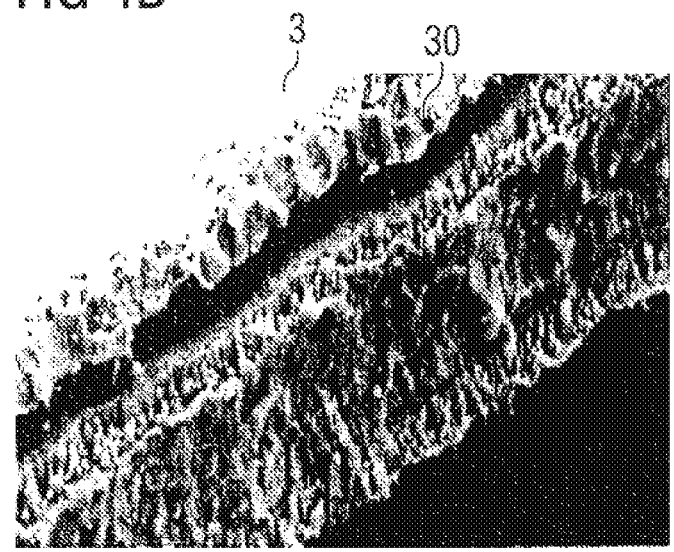

In the case of semiconductor chips which have been produced by the described method, the functional layer has traces of material removal by coherent radiation on a side surface 101 of the semiconductor chip (cf. FIG. 4B).

Photographs of a divided semiconductor chip are shown in FIGS. 4A and 4B. While the carrier body 40 in FIG. 4A has a grooved structure typical for a chemical material removal, the functional layer 3, in this exemplary embodiment a metal layer, displays traces 30 typical for material removal by coherent radiation (FIG. 4B).

This patent application claims the priority of German patent application 10 2013 108 583.0, the disclosure content of which is hereby incorporated by reference.

The invention is not limited by the description made with reference to the exemplary embodiments. Rather, the invention encompasses any new feature and any combination of features, including in particular any combination of features in the claims, even if this feature or this combination is not itself explicitly indicated in the claims or exemplary embodiments.

The invention claimed is:

1. A method for dividing a composite into a plurality of semiconductor chips along a dividing pattern, comprising the following steps:
   a) providing a composite which has a carrier, a semiconductor layer sequence and a functional layer;
   b) forming separating trenches in the carrier along the dividing pattern; and
   c) cutting through the functional layer by means of coherent radiation along the dividing pattern,
   wherein the divided semiconductor chips each have a part of the semiconductor layer sequence, of the carrier and of the functional layer,
   wherein the functional layer is first removed by means of coherent radiation before the separating trenches are formed by etching from the same side of the composite, the functional layer serving as a mask for the formation of the separating trenches so that a separate mask during formation of the separating trenches is dispensed with,
   wherein the functional layer comprises a connection layer by which the semiconductor layer sequence is attached to the carrier,
   wherein the functional layer comprises a metallic mirror layer as a partial layer,
   wherein the metallic mirror layer is configured to reflect the generated radiation, and
   wherein the connection layer is a solder layer.

2. The method according to claim 1, wherein the semiconductor layer sequence is divided into a plurality of semiconductor bodies by means of mesa trenches prior to step c).

3. The method according to claim 2, wherein the functional layer is cut through in step c) along the mesa trenches.

4. The method according to claim 1, wherein the semiconductor layer sequence is divided into a plurality of semiconductor bodies by means of mesa trenches, the semiconductor layer sequence and the functional layer being cut through in a common production step in step c).

5. The method according to claim 1, wherein the coherent radiation in step c) is laser radiation with a pulse duration in the nanosecond or picosecond range.

6. The method according to claim 5, wherein the laser radiation comprises mutually successive sub-pulses within the pulse duration.

7. The method according to claim 1, wherein the functional layer comprises a metallic layer and/or a dielectric layer and wherein the carrier contains a semiconductor material.

8. The method according to claim 1, wherein the functional layer is disposed between the semiconductor layer sequence and the carrier.

9. The method according to claim 1, wherein the functional layer extends over the whole surface of the composite before step c).

10. The method according to claim 1, wherein the separating trenches extend completely through the carrier after step b).

11. The method according to claim 1, wherein the composite is attached to an auxiliary carrier before division and the semiconductor chips are present on the auxiliary carrier in a geometric arrangement after division.

12. The method according to claim 1, wherein, in step c), the functional layer is cut through only in places along the dividing pattern so that at least one region of the composite has a plurality of contiguous semiconductor chips after step b) and step c).

* * * * *